(12) United States Patent
Knudsen et al.

(10) Patent No.: US 7,829,369 B2
(45) Date of Patent: Nov. 9, 2010

(54) METHODS OF FORMING OPENINGS

(75) Inventors: Daniel Knudsen, Nampa, ID (US); James Chapman, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 687 days.

(21) Appl. No.: 11/777,055

(22) Filed: Jul. 12, 2007

(65) Prior Publication Data

US 2009/0017575 A1    Jan. 15, 2009

(51) Int. Cl.
  *H01L 21/00*  (2006.01)
(52) U.S. Cl. ............... 438/65; 438/70; 257/E21.257
(58) Field of Classification Search ............. 438/70, 438/65; 257/E21.257
  See application file for complete search history.

(56) References Cited

U.S. PATENT DOCUMENTS

| | | | |
|---|---|---|---|
| 6,063,658 A | 5/2000 | Horak et al. | |
| 6,177,333 B1 | 1/2001 | Rhodes | |
| 6,214,670 B1 | 4/2001 | Shih et al. | |
| 6,566,198 B2 | 5/2003 | Park et al. | |
| 6,756,297 B2 | 6/2004 | Park | |
| 6,856,001 B2 | 2/2005 | Rhodes | |
| 6,861,686 B2 * | 3/2005 | Lee et al. | 438/60 |
| 7,071,531 B2 | 7/2006 | Rhodes | |
| 7,176,142 B2 * | 2/2007 | Mizutani et al. | 438/745 |
| 7,473,639 B2 * | 1/2009 | Jung | 438/629 |
| 7,635,645 B2 * | 12/2009 | Lee et al. | 438/637 |
| 2003/0075758 A1 | 4/2003 | Sundaresan et al. | |
| 2005/0045927 A1 | 3/2005 | Li | |
| 2006/0003518 A1 | 1/2006 | Harter et al. | |
| 2006/0163672 A1 | 7/2006 | Wang et al. | |

OTHER PUBLICATIONS

A.H.Z. Ahmed, et al. "Fabrication of a self-absorbing, self-supported complementary metal-oxide-semiconductor compatible microcmachined bolometer" © 2004 American Vacuum Society, May/Jun. 2004.
U.S. Appl. No. 11/513,246, filed Aug. 31, 2006, Akram.

* cited by examiner

*Primary Examiner*—W. David Coleman
*Assistant Examiner*—Sun M Kim
(74) *Attorney, Agent, or Firm*—David C. Kellogg (57) ABSTRACT

Some embodiments include methods of forming openings in which a metal-containing structure is formed over a region of a semiconductor substrate. A patterned metal-containing material is formed over the metal-containing structure, with the metal-containing material having a gap extending therethrough. An entirety of the metal-containing structure is removed through the gap to leave an opening over the region of the semiconductor substrate. The region of the semiconductor substrate may comprise CMOS sensors, and one or both of filter material and microlens material may be formed within the opening.

30 Claims, 9 Drawing Sheets

_FIG. 7_

_FIG. 8_

METHODS OF FORMING OPENINGS

TECHNICAL FIELD

Methods of forming openings.

BACKGROUND

Integrated circuit fabrication frequently comprises forming openings over regions, and subsequently filling the openings with various materials.

One type of integrated circuitry is complementary metal oxide semiconductor (CMOS) sensor circuitry, which may be utilized for detecting electromagnetic radiation. For instance, CMOS sensor circuitry may be utilized in digital cameras for detecting light.

Several layers may be built over the CMOS sensor circuitry to improve sensitivity of the circuitry and/or to alter sensitivity of the circuitry for different wavelengths of light. For instance, a Bayer filter may be formed over the CMOS sensor circuitry as a combination of red, green and blue filters to create regions of the CMOS sensor circuitry that are sensitive to particular wavelengths of radiation. As another example, microlenses may be formed over regions of the CMOS sensor circuitry to enhance light-gathering by the CMOS sensor circuitry.

The Bayer filter may be formed of material deposited over a semiconductor substrate, and similarly the microlenses may be formed of material deposited over a semiconductor substrate. For instance, the Bayer filter may comprise dyed photoresist, acrylic material, etc.; and the microlenses may comprise polyimide, thermoplastic, thermoset resin, photosensitive gelatin, radiation-curable resin, etc.

It may be desired to form one or both of the microlenses and the filters within openings over the CMOS sensors. Difficulties may be encountered in attempting to align the openings with the CMOS sensors. Accordingly, it is desired to develop new methods of forming openings.

Openings are utilized in many other applications besides fabrication of lenses and filters for CMOS sensors. Difficulties may be encountered in attempting to align openings in such other applications, and accordingly it is desired to develop methods which may be generally applicable for alignment of openings during semiconductor fabrication.

DETAILED DESCRIPTION OF THE ILLUSTRATED EMBODIMENTS

In some embodiments, sacrificial metal-containing material is formed over a region of a semiconductor substrate, and another metal-containing material is formed over the sacrificial metal-containing material and aligned with the sacrificial metal-containing material to define a location for an opening over the region. Subsequently, the sacrificial metal-containing material is removed to form the opening. The use of metal-to-metal alignment may enable better alignment to be achieved than would be achieved utilizing conventional methods for defining the location of the opening.

In some embodiments, sensors (for instance CMOS sensors) are within the region of the semiconductor substrate, and one or both of color filter material and lens material is formed within the opening. In such embodiments, the sacrificial metal-containing material may be a penultimate metal-containing material formed over the substrate, and the other metal-containing material that is formed over the sacrificial metal-containing material may be the uppermost (or final) metal-containing material formed over the substrate. Such final metal-containing material may be utilized to form various conductive structures over the substrate, in addition to being utilized for alignment with the sacrificial metal-containing material in defining the location of the opening. Additionally, the portion of sacrificial metal-containing material may be formed simultaneously with other regions of metal-containing material that are not sacrificial, but rather are utilized in forming various conductive structures over the substrate.

Example embodiments are described with reference to FIGS. 1-14.

Figure 1:
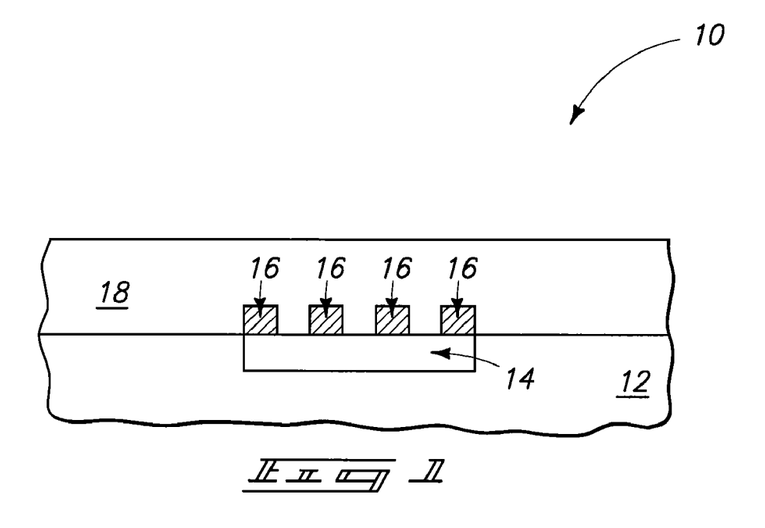
FIG. 1 is a diagrammatic, cross-sectional view of a portion of a semiconductor construction at a processing stage of an embodiment.

FIG. 1 shows a portion of a semiconductor construction 10. The construction includes a base 12 supporting a sensor region 14.

Base 12 may comprise semiconductor material, and may, for example, comprise, consist essentially of, or consist of monocrystalline silicon. The base may be referred to as a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc.

The sensor region 14 may comprise various circuit components extending within base 12, and/or formed over base 12. In some embodiments, the sensor region 14 may comprise an array of sensors configured for detecting electromagnetic radiation, such as, for example, CMOS sensors. The sensors are not individually illustrated within region 14 in order to simplify the drawing. The sensors may comprise conventional constructions.

A plurality of metal-containing lines 16 are formed over sensor region 14. The metal-containing lines may extend into and out of the page relative to the cross-section of FIG. 1. In embodiments in which the sensor region 14 comprises CMOS sensors, individual sensors may be between adjacent lines 16, in accordance with a conventional construction.

A dielectric material 18 extends over conductive lines 16 and within the gaps between the conductive lines. The dielectric material may comprise any suitable composition or combination of compositions, and may, for example, comprise silicon dioxide formed by chemical vapor deposition (CVD) utilizing tetraethylorthosilicate (TeOS). The dielectric material has a planarized upper surface in the shown embodiment. The surface may be planarized by, for example, chemical-mechanical polishing (CMP).

Figure 2:
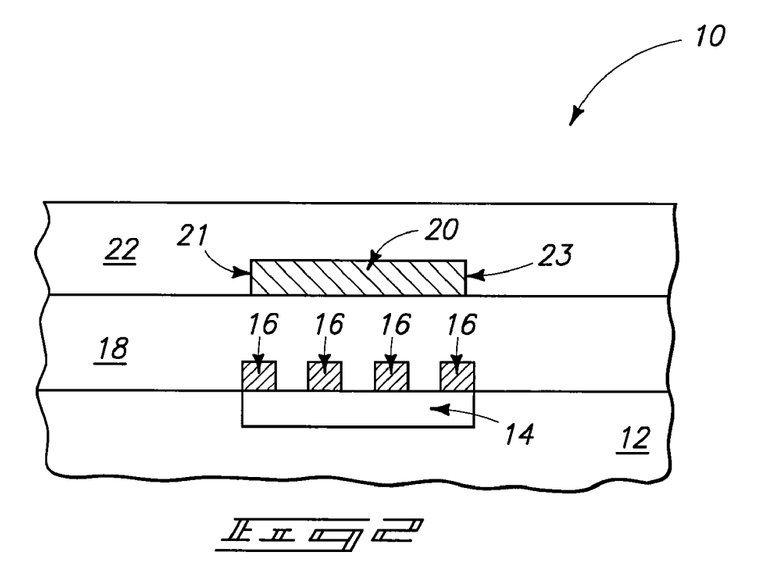
FIG. 2 is a view of the portion of FIG. 1 shown at a processing stage subsequent to that of FIG. 1.

Referring to FIG. 2, a metal-containing structure 20 is formed over sensor region 14. The metal-containing structure is directly over at least a portion of the sensor region, and in some embodiments is directly over an entirety of the sensor region. The metal-containing structure is a block (which may also be referred to as a discrete segment) having a lateral width and a pair of sidewall edges 21 and 23 on opposing sides of the width. The edges 21 and 23 may be referred to as a first edge and a second edge, respectively.

The metal-containing structure 20 is a sacrificial structure, and may comprise any suitable composition or combination of compositions. For example, structure 20 may comprise elemental metal and/or metal-containing compositions. In some embodiments, metal-containing structure 20 may comprise, consist essentially of, or consist of aluminum.

Although the metal-containing structure 20 is sacrificial, it may be formed as part of a metal layer (or process level) containing other sections (not shown) which are not sacrificial, but which are instead part of an integrated circuit supported by base 12.

Metal-containing structure 20 may be patterned into the shown configuration by forming a layer of metal-containing material over dielectric material 18, forming a photolithographically-patterned photoresist mask (not shown) over the metal-containing material, and transferring a pattern from the mask to the metal-containing material. The mask may be removed after the pattern is transferred to the metal-containing material.

A dielectric material 22 is formed over metal-containing structure 20. Dielectric material 22 may comprise the same composition as dielectric material 18, or may comprise a different composition. In some embodiments, dielectric material 22 may comprise, consist essentially of, or consist of silicon dioxide; such as, for example, silicon dioxide formed by CVD utilizing TeOS. Dielectric material 22 has a planarized upper surface in the shown embodiment. The surface may be planarized by, for example, CMP.

Figure 3:
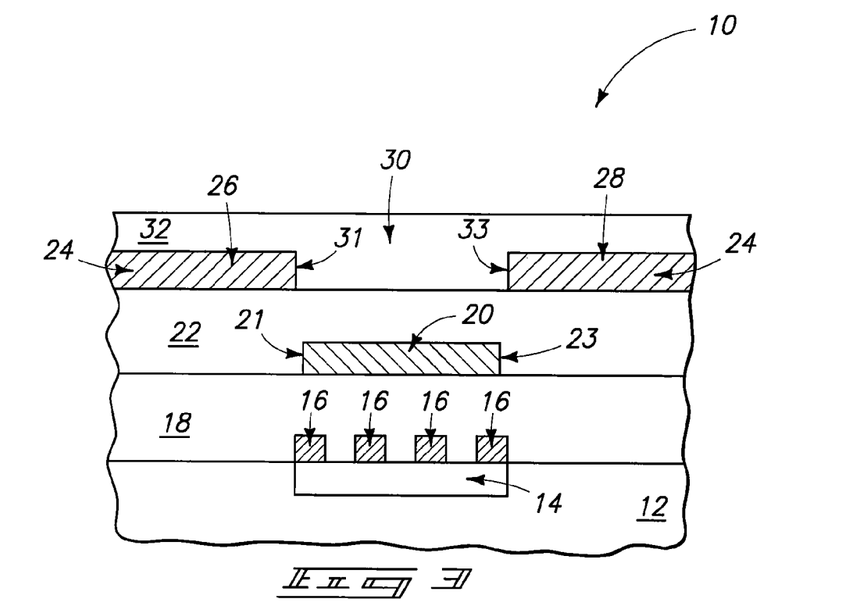
FIG. 3 is a view of the portion of FIG. 1 shown at a processing stage subsequent to that of FIG. 2.

Referring to FIG. 3, a metal-containing material 24 is formed over dielectric material 22. The metal-containing material 24 may be referred to as a layer or segment, and is patterned to have a pair of portions 26 and 28 in the cross-section of FIG. 3, with such portions being spaced from one another by a gap 30. The metal-containing material 24 may be formed in the shown configuration by the following procedure: initially an expanse of the metal-containing material is formed across an upper surface of dielectric material 22, a patterned mask (for instance, a photolithographically-patterned photoresist mask) is formed over the expanse, the pattern is transferred from the mask to the expanse with one or more suitable etches to form the gap 30 extending entirely through the metal-containing material, and finally the patterned mask is removed.

The gap 30 extends from a first gap edge 31 to a second gap edge 33, and is directly over metal-containing structure 20. The gap may be any suitable width, and in some embodiments may be at least as wide as the metal-containing structure. In some embodiments, gap edges 31 and 33 may be approximately aligned with the edges 21 and 23 of metal-containing structure 20. Specifically, gap edge 31 may be directly over metal-containing structure edge 21 to within a tolerance of about 0.5 microns (within a tolerance of about 0.1 microns in some embodiments), and gap edge 33 may be directly over metal-containing structure edge 23 to within a tolerance of about 0.5 microns (within a tolerance of about 0.1 microns in some embodiments). In some embodiments, gap edges 31 and 33 will be laterally outward of the edges 21 and 23, respectively, of the metal-containing structure 20. For instance, gap 30 may have a lateral width in the shown cross-section that is at least about 1 micron wider than the lateral width of structure 20.

The term "directly over" is used to indicate vertical alignment of structures, and is distinguished from the term "over" which merely indicates that one structure is above another. Accordingly, a first structure is over a second structure if the first structure is above the second structure regardless of any lateral displacement that may exist between the first and second structures; and a first structure is "directly over" a second structure if the first structure is vertically aligned with the second structure (in other words if at least a portion of the first structure is not laterally displaced relative to at least a portion of the second structure).

The metal-containing material 24 may comprise any suitable composition or combination of compositions; and may, for example, comprise elemental metal and/or metal-containing compositions. In some embodiments, metal-containing material 24 and metal-containing structure 20 may comprise, consist essentially of, or consist of the same composition as one another. For instance, the metal-containing material 24 and metal-containing structure 20 may both comprise, consist essentially of, or consist of aluminum. In other embodiments the metal-containing material 24 may be of a different composition than the metal-containing structure 20. For instance, in some embodiments the metal-containing material 24 may consist essentially of, or consist of copper, while the metal-containing structure 20 consists essentially of, or consists of aluminum.

A dielectric material 32 is formed over metal-containing material 24 and within gap 30. Dielectric material 32 may comprise the same composition as one or both of the other dielectric materials 18 and 22, or may comprise a different composition than one or both of such other dielectric materials. In some embodiments, dielectric material 32 may comprise, consist essentially of, or consist of silicon dioxide; such as, for example, silicon dioxide formed by CVD utilizing TeOS. In some embodiments, dielectric materials 22 and 32 may be referred to as first and second dielectric materials, respectively, to distinguish such dielectric materials from one another.

Dielectric material 32 has a planarized upper surface in the shown embodiment. The surface may be planarized by, for example, CMP.

Figure 4:
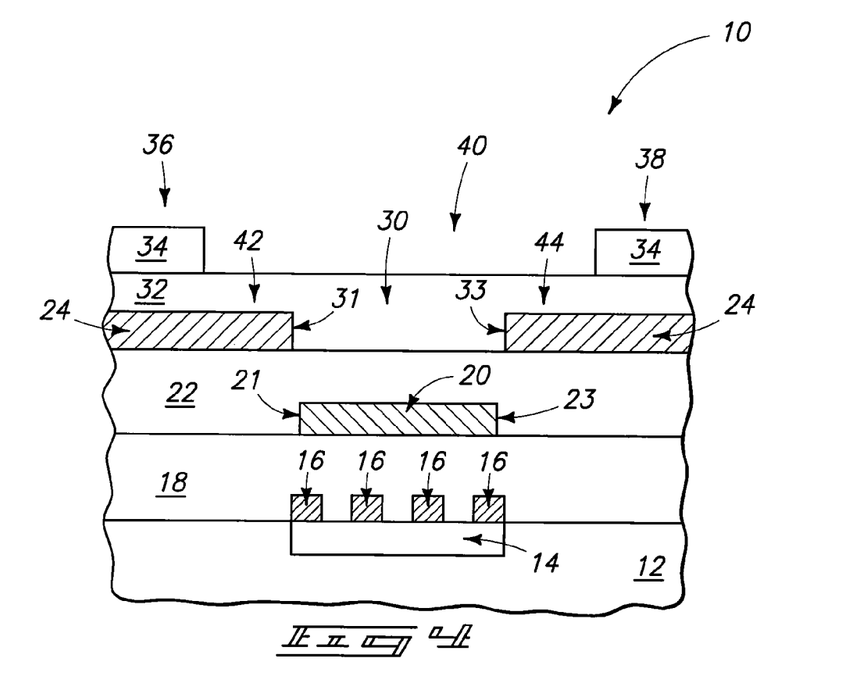
FIG. 4 is a view of the portion of FIG. 1 shown at a processing stage subsequent to that of FIG. 3.

Referring to FIG. 4, masking material 34 is formed over an upper surface of dielectric material 32. The masking material is patterned comprise a pair of portions 36 and 38 in the shown cross-section, with such portions having a laterally-extending space 40 between them. In the shown embodiment, the space 40 is laterally wider than gap 30. The space 40 is directly over gap 30, and also directly over sections of metal-containing material 24 adjacent gap 30. Such sections of metal-containing material 24 are labeled 42 and 44 in FIG. 4.

The masking material may comprise any suitable composition or combination of compositions, and in some embodiments may comprise, consist essentially of, or consist of photolithographically-patterned photoresist.

An advantage of the processing of FIG. 4 relative to that of other methods is that the vertical proximity of the sacrificial metal-containing structure 20 to the metal-containing material 24 can simplify alignment of the metal-containing material 24 to the structure 20 relative to the alignment that would otherwise occur between the mask 34 and the structure 20. Specifically, the alignment of metal-containing layers 20 and 24 to one another takes advantage of the vertical proximity of such layers, which can improve the alignment relative to alignment which would occur between layers that are more vertically distant from one another.

Figure 5:
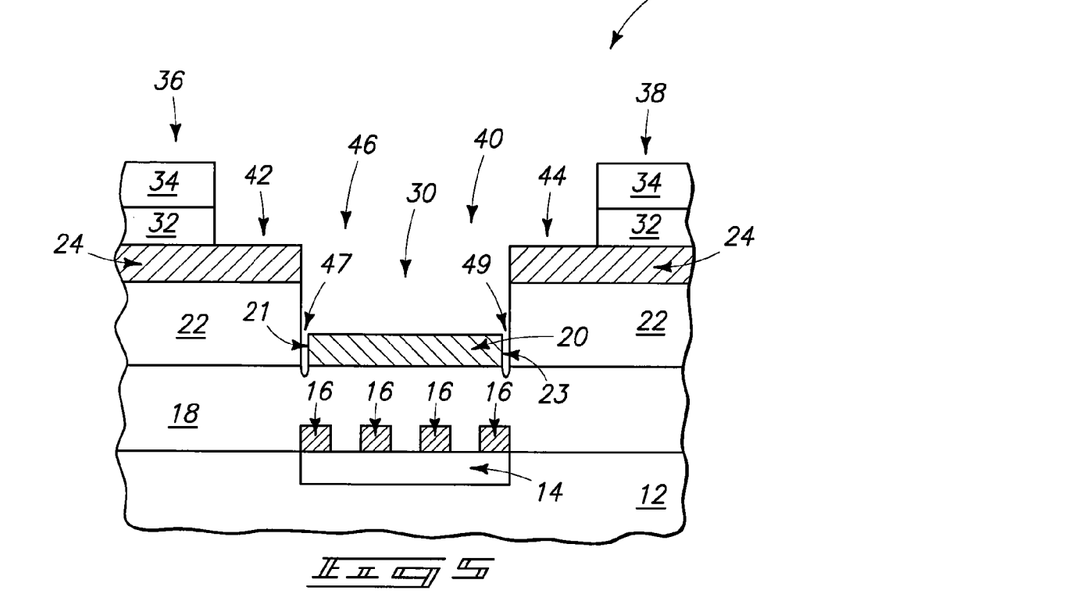
FIG. 5 is a view of the portion of FIG. 1 shown at a processing stage subsequent to that of FIG. 4.

Referring to FIG. 5, exposed portions of dielectric materials 22 and 32 are removed with one or more suitable etches. For instance, if dielectric materials 22 and 32 consist of silicon dioxide, such materials may be removed with an etch utilizing one or more of $CF_4$, $C_2F_6$, $C_3F_8$, $CHF_3$ and $H_2$. In some embodiments, the removal of the exposed portions of dielectric materials 22 and 32 may be considered to be etching of the dielectric material 22 and 32 through the space 40 between portions 36 and 38 of masking material 34.

The removal of exposed portions of dielectric materials 22 and 32 forms an opening 46 extending to an upper surface of metal-containing a structure 20. In the shown embodiment, gap 30 is wider than metal-containing structure 20, and accordingly portions of dielectric material 22 are exposed along edges 21 and 23 of the metal-containing structure. Removal of such exposed portions of dielectric material 22 forms cavities 47 and 49 along the sidewall edges. If dielectric material 18 comprises a material that is etched during removal of dielectric material 22, the cavities may extend into dielectric material 18 (as shown). If the alignment between edges of gap 30 and edges of structure 20 is tight enough, the cavities in material 18 may not be formed.

The removal of the exposed portions of dielectric materials 22 and 32 has left an entirety of an upper surface of metal-containing structure 20 exposed within gap 30, and has also left upper surfaces of the sections 42 and 44 of metal-containing material 24 exposed within space 40.

Figure 6:
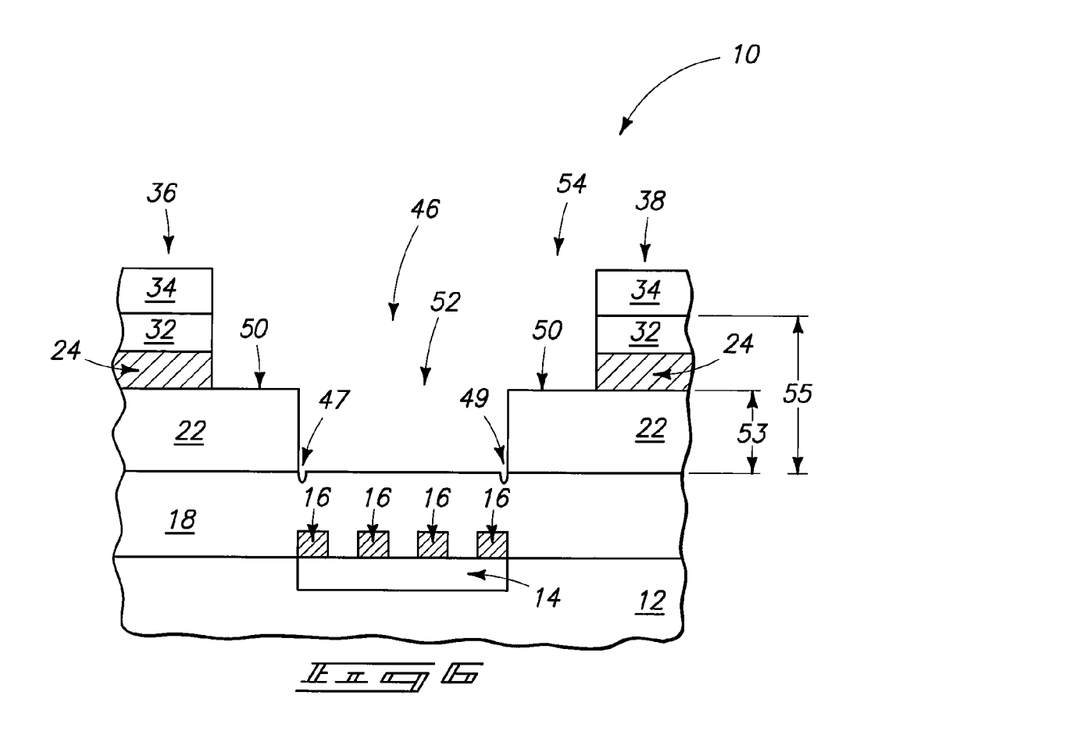
FIG. 6 is a view of the portion of FIG. 1 shown at a processing stage subsequent to that of FIG. 5.

Referring to FIG. 6, the entirety of metal-containing structure 20 (FIG. 5) and the exposed sections 42 and 44 (FIG. 5) of metal-containing material 24 are removed with one or more suitable etches. For instance, if both metal-containing structure 20 and metal-containing material 24 consist of aluminum, a suitable etch may include one or more of $BCl_3$, $CCl_4$, $SiCl_4$, and $Cl_2$.

The removal of the exposed sections of metal-containing material 24 and the entirety of metal-containing structure 20 expands and extends opening 46. The resultant opening has a substantially horizontal step 50 between a lower narrow portion 52 and an upper wider portion 54. The lower narrow portion extends from an upper surface of the dielectric 18 to an upper surface of dielectric 22, and accordingly extends to a height 53. The total depth of opening 46 may be considered to be from an upper surface of dielectric 18 to an upper surface of dielectric 32, and accordingly is a depth 55. In some embodiments, height 53 may be about one-half of depth 55. For instance, depth 55 may be about two microns, and height 53 may be about one micron.

Figure 7:
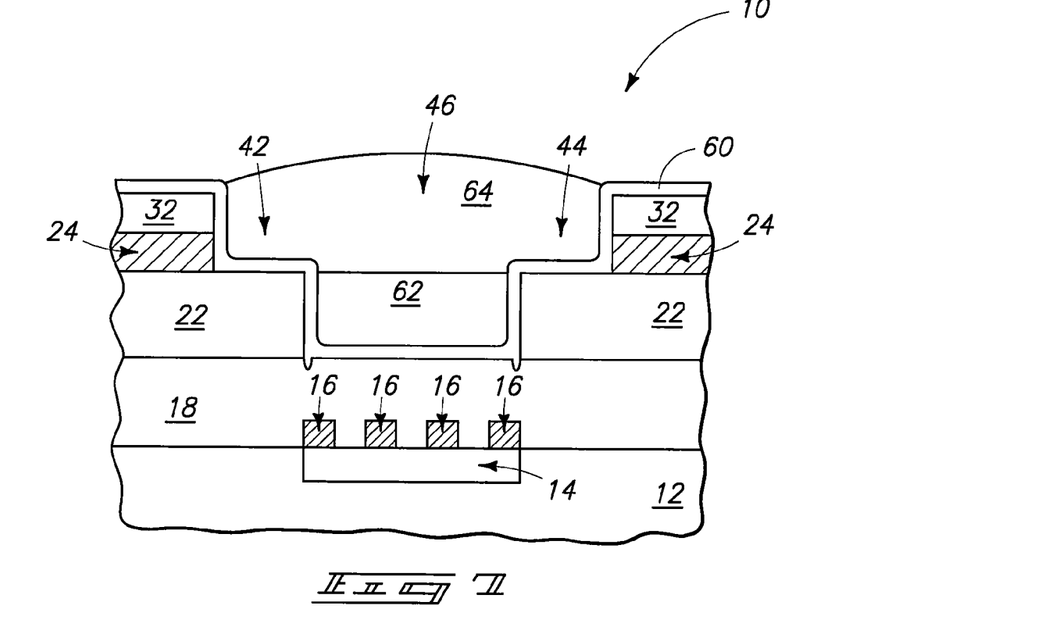
FIG. 7 is a view of the portion of FIG. 1 shown at a processing stage subsequent to that of FIG. 6.

Referring to FIG. 7, masking material 34 (FIG. 6) is removed, and a barrier material 60 is formed within opening 46. The barrier material 60 lines the opening, and accordingly narrows the opening. Barrier material 60 may comprise any suitable composition or combination of compositions that alleviate migration between materials outside of the opening and other materials that are subsequently formed in the opening. In some embodiments, material 60 may be a dielectric material, and may, for example, comprise, consist essentially of, or consist of silicon nitride.

A color filter material 62 is formed within opening 46 and over liner 60, and subsequently a lens material (which may be referred to as a microlens material) 64 is formed within the opening and over the color filter material. The color filter material and lens material may comprise conventional compositions. In some embodiments, multiple color filter materials and/or multiple lens materials may be formed within individual openings. In some embodiments color filter material may not be provided within the opening (for instance, if the sensor region is to be used only for black and white imaging), and in some embodiments the lens material may not be provided within the opening. Other materials may be formed within the opening in addition to, or alternatively to, one or both of the color filter material and the lens material.

In the shown embodiment, the color filter material is formed within the narrower lower portion of opening 46, and the lens material is formed within the wider upper portion of the opening. Accordingly, the stepped configuration of the opening may be utilized to assist in vertical placement of materials formed over sensor array 14. In some embodiments, the color filter material can extend into the wide portion of the opening, or the lens material can extend into the narrow portion of the opening.

Among the advantages of the processing of FIGS. 1-7 relative to conventional processing is that the processing of FIGS. 1-7 may be done utilizing metal-containing structures formed during formation of metal-containing layers that would already be present over a semiconductor substrate. Accordingly, the methodology of FIGS. 1-7 may be incorporated into a process by modifying existing reticles rather than introducing additional masks. For instance, metal-containing structure 20 may be introduced by modifying a reticle that is already being utilized to form a metal-containing layer at the level of structure 20 over a semiconductor substrate.

The processing of FIGS. 6 and 7 illustrates an embodiment in which exposed sections of metal-containing material 24 are entirely removed during the removal of metal-containing structure 20. In other embodiments, the exposed sections of metal-containing material 24 may not be entirely removed during the removal of metal-containing structure 20. An example of such other embodiments is discussed with reference to FIGS. 8 and 9. Similar numbering will be used to describe FIGS. 8 and 9 as is used above to describe FIGS. 1-7.

Figure 8:
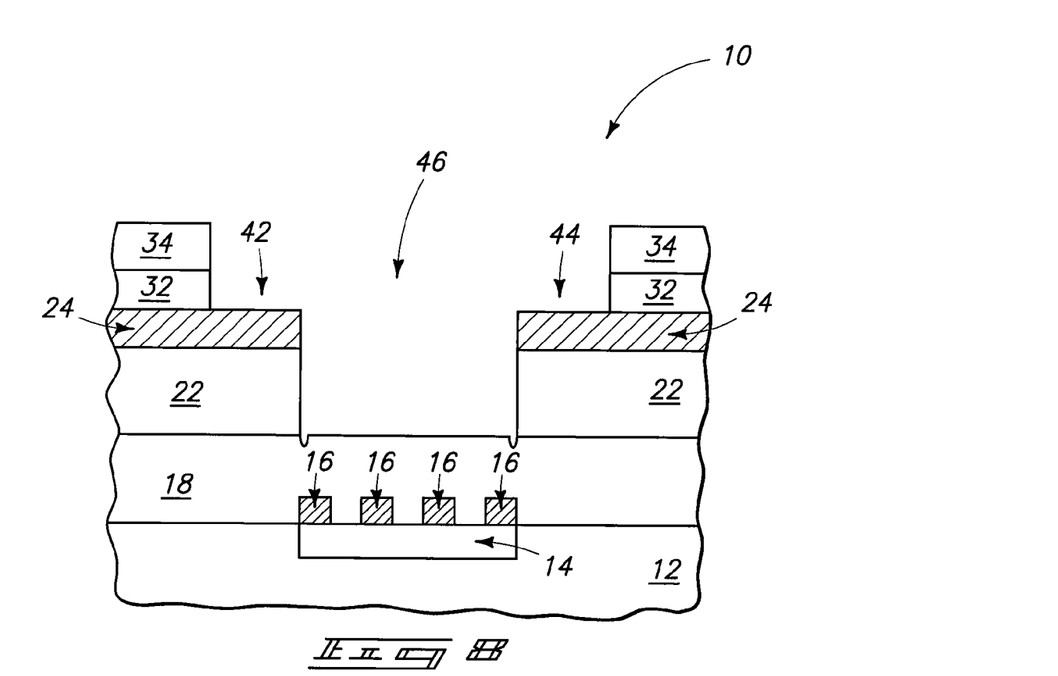
FIG. 8 is a view of the portion of FIG. 1 shown at a processing stage subsequent to that of FIG. 5 in accordance with another embodiment.

Referring to FIG. 8, construction 10 is shown at a processing stage subsequent to that of FIG. 5. The metal-containing structure 20 (FIG. 5) has been removed, but the exposed sections 42 and 44 of metal-containing material 24 have not been removed. Such can be accomplished by forming metal-containing material 24 to be of a different composition than metal-containing structure 20, and then utilizing an etch selective for the composition of structure 20 relative to that of material 24 to remove the structure 20. For instance, in some embodiments structure 20 may be formed to consist of aluminum, and material 24 may be formed to consist of copper.

Figure 9:
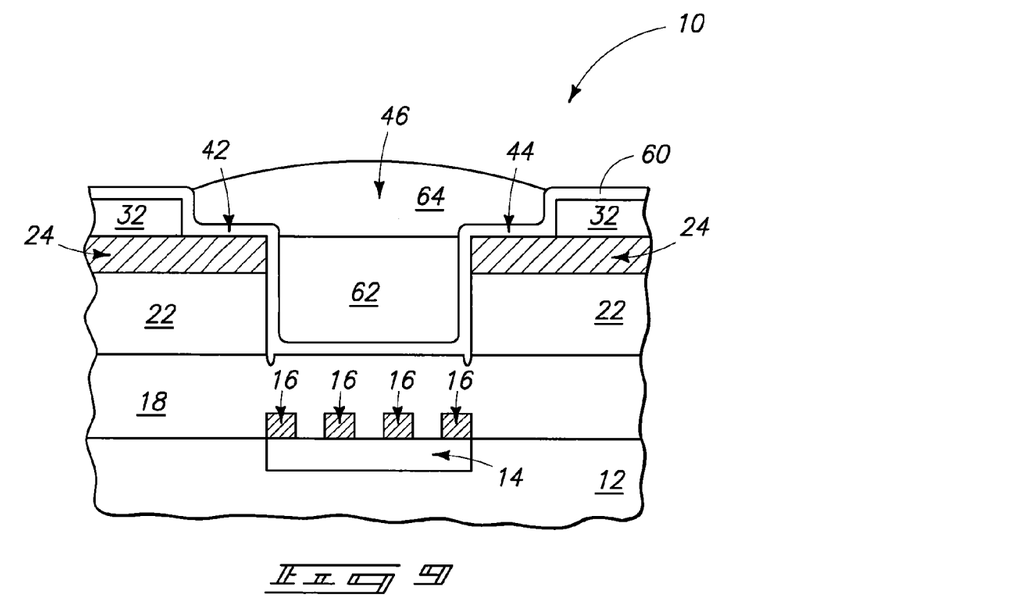
FIG. 9 is a view of the portion of FIG. 8 shown at a processing stage subsequent to that of FIG. 8.

Referring to FIG. 9, masking material 34 (FIG. 8) is removed, and then the liner 60, color filter material 62 and lens material 64 are formed within opening 46 to create a construction analogous to that discussed above with reference to FIG. 7. The embodiment of FIG. 9 differs from that of FIG. 7 in that the liner 60 of FIG. 9 extends across an upper surface of metal-containing material 24 along the sections 42 and 44, whereas the liner of FIG. 7 does not extend across an upper surface of metal-containing material 24.

The processing of FIGS. 1-9 may, in some embodiments, comprise utilization of a top-most metal layer 24 and a structure 20 formed from a penultimate metal layer during fabrication of an opening. In other embodiments, other metal layers may be utilized during fabrication of the opening. Additionally, or alternatively, an opening may be formed utilizing a cascade of etches through multiple sacrificial metal-containing structures. FIGS. 10-14 illustrate an example process for forming an opening utilizing a cascade of etches. In referring to FIGS. 10-14, similar numbering will be used as is utilized above in describing FIGS. 1-9, where appropriate.

Figure 10:
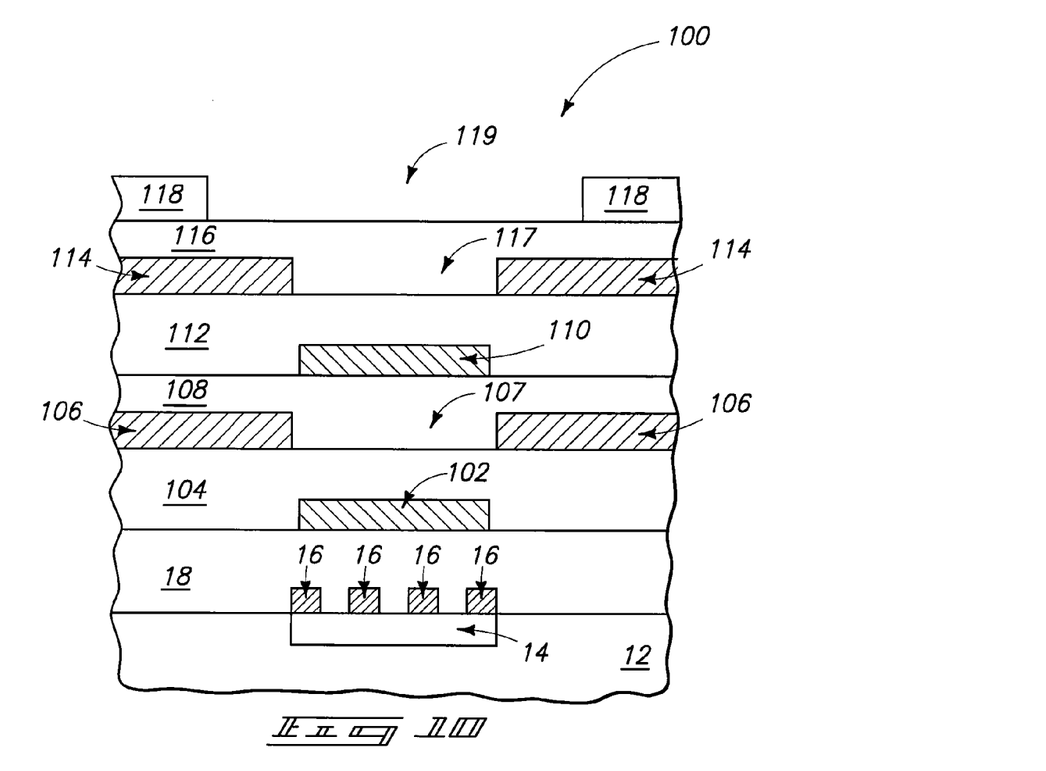
FIG. 10 is a diagrammatic, cross-sectional view of a portion of a semiconductor construction at a processing stage of another embodiment.

Referring to FIG. 10, a construction 100 is shown to comprise the base 12, sensor array 14, metal-containing lines 16 and insulative material 18 discussed above.

A first metal-containing structure 102 is over dielectric material 18, and a dielectric material 104 is over the first metal-containing structure. The metal-containing structure 102 may comprise any of the compositions of the structure 20 discussed above. The dielectric material 104 may comprise any of the compositions of the dielectric 22 discussed above.

A first metal-containing material 106 is over dielectric material 104, and a dielectric material 108 is over the first metal-containing material. The first metal-containing material comprises a gap 107 extending therethrough and directly over metal-containing structure 102. The metal-containing material 106 may comprise any of the compositions of the material 24 discussed above. The dielectric material 108 may comprise any of the compositions of the material 32 discussed above.

A second metal-containing structure 110 is formed over dielectric material 108, and a dielectric material 112 is formed over the second metal-containing structure. The second metal-containing structure 110 may comprise any of the compositions of the structure 20 discussed above. The dielectric material 112 may comprise any of the compositions of the material 18 discussed above.

A second metal-containing material 114 is formed over the dielectric material 112, and a dielectric material 116 is formed over the second metal-containing material. A gap 117 extends through the second metal-containing material, with such gap being directly over metal-containing structure 110. The metal-containing material 114 may comprise any of the compositions of the material 24 discussed above. The dielectric material 108 may comprise any of the compositions of the material 32 discussed above.

A patterned masking material 118 is over dielectric material 116. A space 119 extends between portions of the masking material 118. The patterned masking material may comprise any of the compositions discussed above relative to the masking material 34.

Figure 11:
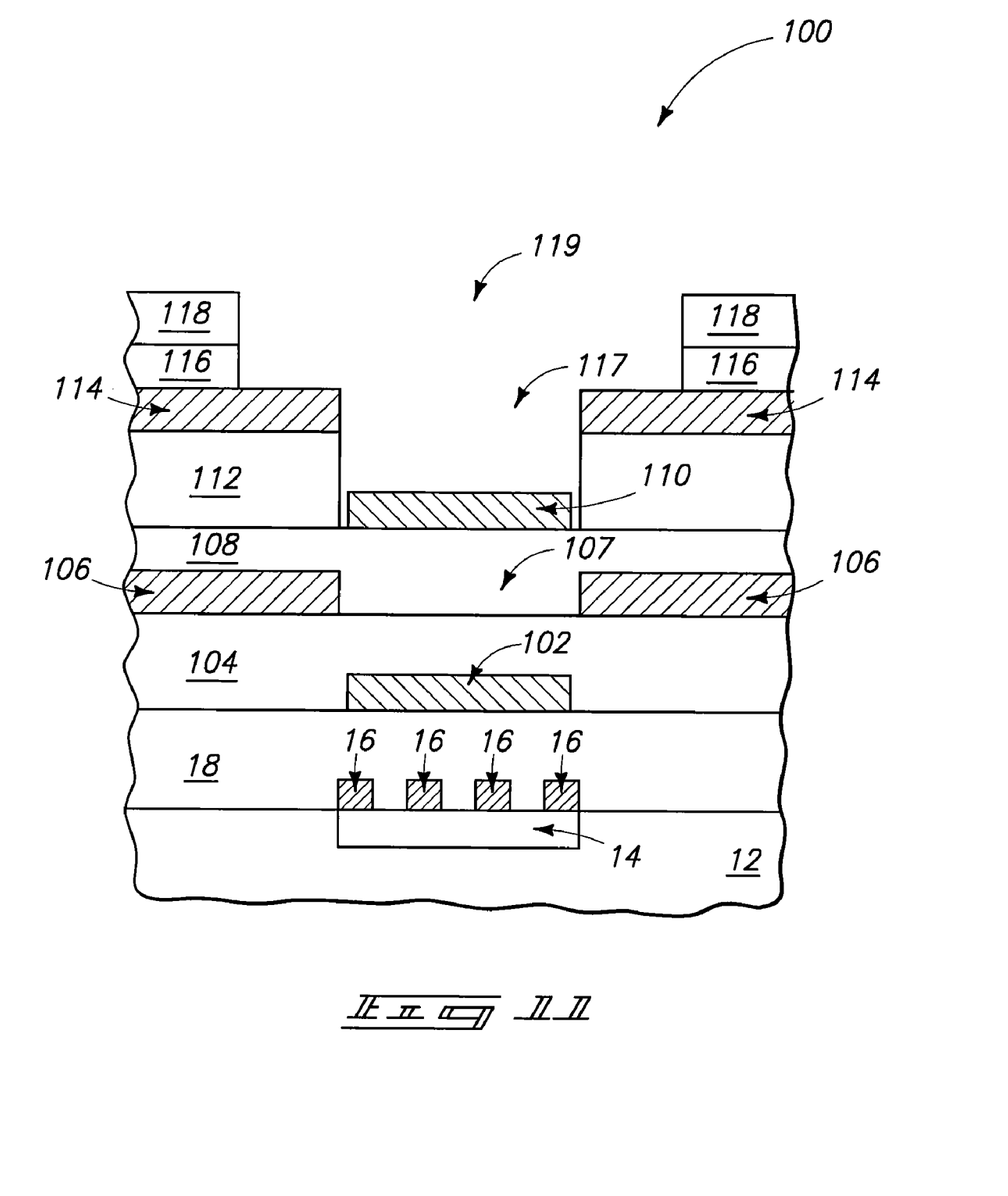
FIG. 11 is a view of the portion of FIG. 10 shown at a processing stage subsequent to that of FIG. 10.

Referring to FIG. 11, portions of the dielectric materials 112 and 116 exposed within gap 117 and space 119 are removed with one or more suitable etches.

Figure 12:
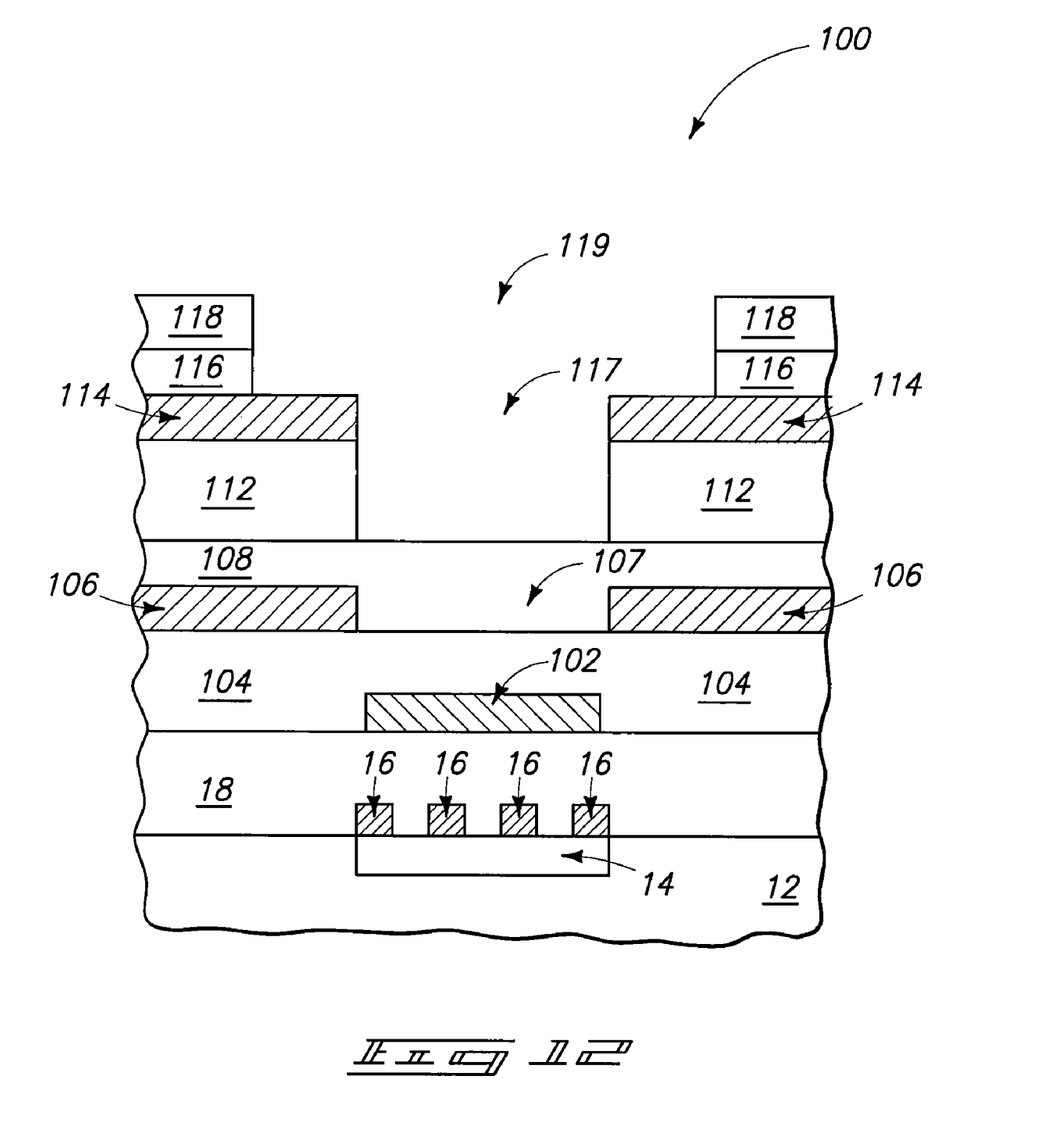
FIG. 12 is a view of the portion of FIG. 10 shown at a processing stage subsequent to that of FIG. 11.

Referring to FIG. 12, an entirety of the second metal-containing structure 110 is removed with one or more suitable etches. In the shown embodiment, exposed portions of second metal-containing material 114 are not removed. In other embodiments, such exposed portions may be removed with processing analogous to that discussed above with reference to FIG. 6.

Figure 13:
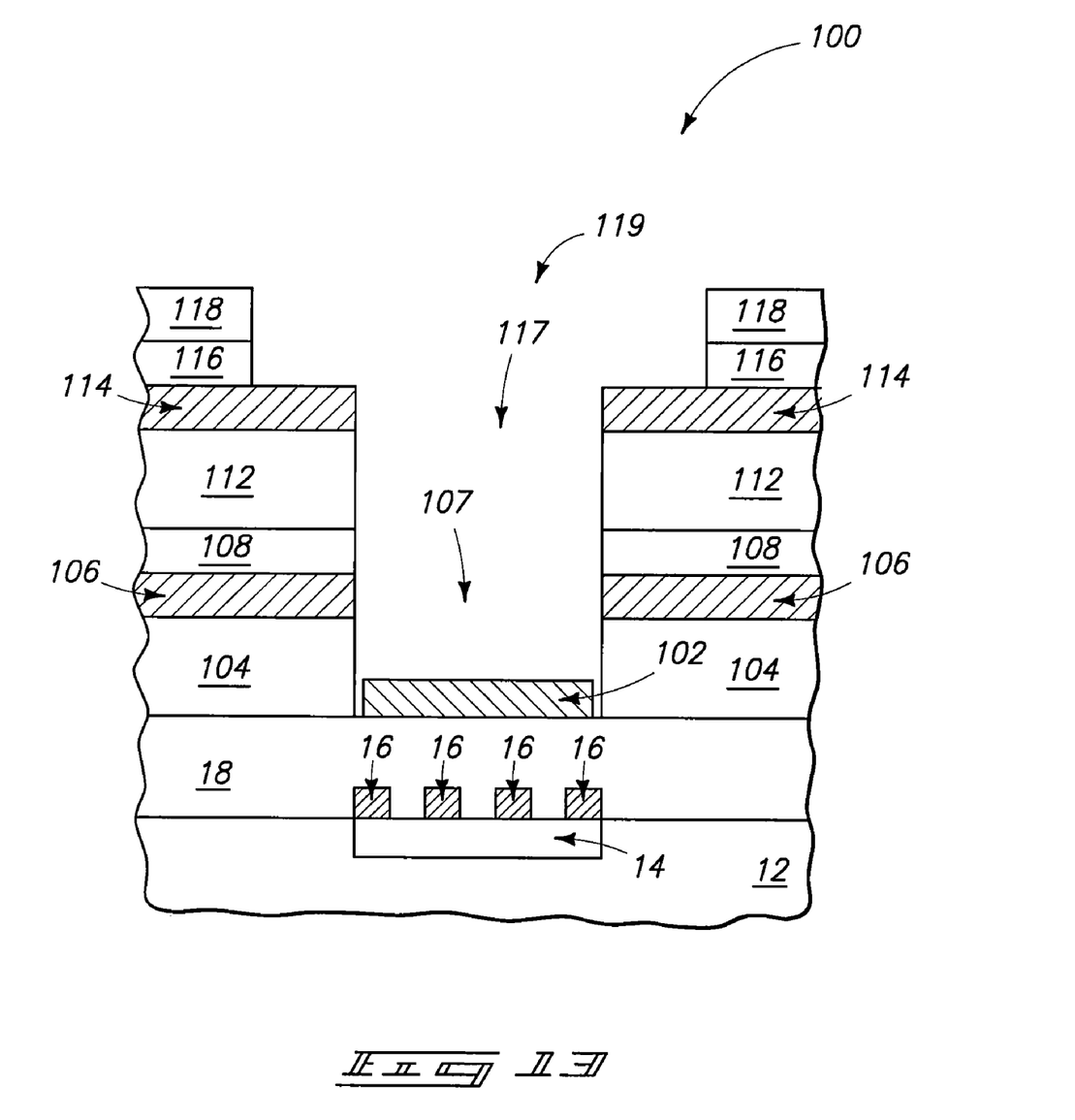
FIG. 13 is a view of the portion of FIG. 10 shown at a processing stage subsequent to that of FIG. 12.

Referring to FIG. 13, portions of dielectric materials 104 and 108 exposed within gaps 107 and 117 are removed with one or more suitable etches.

Figure 14:
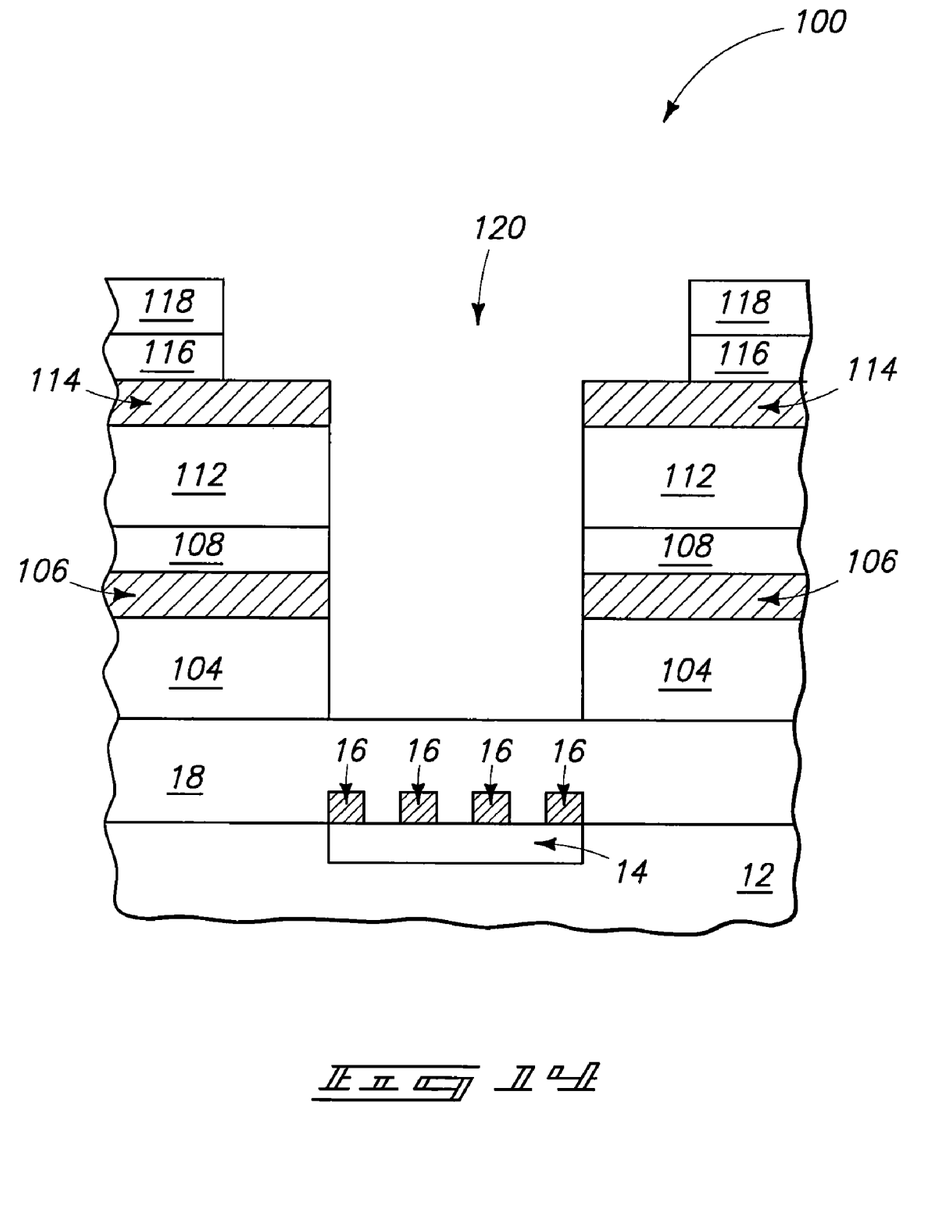
FIG. 14 is a view of the portion of FIG. 10 shown at a processing stage subsequent to that of FIG. 13.

Referring to FIG. 14, the first metal-containing structure 102 is removed to leave an opening 120 extending through dielectric materials 104, 108, 112 and 116, as well as through metal-containing materials 106 and 114. In subsequent processing, materials may be formed within opening 120. Such materials may, for example, include the barrier, color filter and lens materials described with reference to FIG. 7.

The specific embodiments shown in FIGS. 1-14 illustrate formation of openings over sensor arrays. Other embodiments may form the openings over other structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an opening, comprising:
   forming a metal-containing structure in a first layer over a region of a semiconductor substrate;
   forming dielectric material in at least a second layer over the metal-containing structure;
   forming a patterned metal-containing material in at least a third layer over the dielectric material, the patterned metal-containing material having a gap extending therethrough; and
   removing an entirety of the metal-containing structure through the gap to leave an opening over the region of the semiconductor substrate, wherein:
   the first layer is above the region;
   the second layer is above the first layer;
   the third layer is above the second layer;
   at least some of the dielectric material is located between the metal-containing structure and the patterned metal-containing material; and
   the metal-containing structure is electrically isolated from the patterned metal-containing material by the dielectric material that is located between the metal-containing structure and the patterned metal-containing material.

2. The method of claim 1 wherein the region comprises at least one electromagnetic radiation-detecting sensor, and further comprising forming color filter material within the opening.

3. The method of claim 2 further comprising forming lens material within the opening and over the color filter material.

4. The method of claim 2 further comprising forming dielectric material within the opening to narrow the opening prior to the formation of the color filter material.

5. The method of claim 1 wherein the metal-containing structure and the metal-containing material are the same composition as one another.

6. The method of claim 5 wherein some of the metal-containing material is protected with an overlying protective material during the removal of the metal-containing structure, wherein a portion of the metal-containing material is exposed during the removal of the metal-containing structure, and wherein said exposed portion is removed during the removal of the metal-containing structure.

7. The method of claim 5 wherein the metal-containing structure and the metal-containing material both consist of aluminum.

8. The method of claim 1 wherein the metal-containing structure and the metal-containing material are different in composition from one another.

9. The method of claim 8 wherein the metal-containing structure comprises aluminum and the metal-containing material comprises copper.

10. The method of claim 1 wherein the metal-containing structure has a lateral width; and wherein the gap in the metal-containing material is directly over the entirety of said lateral width.

11. The method of claim 10 wherein the gap has about the same lateral width as the lateral width of the metal-containing structure.

12. The method of claim 10 wherein the gap is laterally wider than the lateral width of the metal-containing structure by at least about 1 micron.

13. A method of forming an opening, comprising:
forming a metal-containing block in a first layer over a region of a semiconductor substrate, the metal-containing block having a laterally-extending width, the width extending from a first block edge to a second block edge;
forming a dielectric material in at least a second layer over the metal-containing block;
forming a metal-containing material in at least a third layer over the dielectric material;
removing a portion of the metal-containing material to form a gap extending through the metal-containing material; the gap being directly over the metal-containing block and having a laterally-extending width; the width of the gap extending from a first gap edge to a second gap edge; the gap being at least as wide as the metal-containing block; the first and second gap edges being laterally outward of the first and second block edges;
forming a patterned mask over the metal-containing material; the patterned mask having a laterally-extending cross-section comprising a pair of portions with a space between them, said space being directly over the gap and also being directly over sections of the metal-containing material adjacent the gap;
etching through the space to remove the dielectric material from over the metal-containing segment and thereby expose the entirety of an upper surface of the metal-containing block; and
removing the exposed metal-containing block to form an opening, wherein:
the first layer is above the region;
the second layer is above the first layer;
the third layer is above the second layer;
at least some of the dielectric material is located between the metal-containing block and the metal-containing material; and
the metal-containing block is electrically isolated from the metal-containing material by the dielectric material that is located between the metal-containing block and the metal-containing material.

14. The method of claim 13 wherein the sections of the metal-containing material are removed during the removal of the metal-containing block.

15. The method of claim 13 wherein the sections of the metal-containing material are not entirely removed during the removal of the metal-containing block.

16. The method of claim 13 wherein the metal-containing block and the metal-containing material are the same composition as one another.

17. The method of claim 16 wherein the metal-containing block and the metal-containing material both comprise aluminum.

18. The method of claim 13 wherein the metal-containing block and the metal-containing material are different in composition from one another.

19. The method of claim 13 wherein:
the dielectric material is a first dielectric material;
a second dielectric material is formed over the metal-containing material;
a height of a lower region of the opening is from a bottom of the metal-containing block to a top of the first dielectric material;
a depth of the opening is from the bottom of the metal-containing block to top of the second dielectric material; and
the height of the lower region of the opening is about one-half of the depth of the opening.

20. A method of forming an opening, comprising:
forming a discrete metal-containing segment over one or more electromagnetic radiation-detecting sensors, the metal-containing segment having a lateral width, the lateral width extending from a first metal-containing segment edge to a second metal-containing segment edge;
forming a first dielectric material over the metal-containing segment;
forming a metal-containing material over the first dielectric material;
removing a portion of the metal-containing material to form a gap extending through the metal-containing material; the gap being directly over the metal-containing segment and having a lateral width; the lateral width of the gap extending from a first gap edge to a second gap edge; the first and second gap edges being within about one-half micron of being directly over the first and second metal-containing segment edges, respectively;
forming a second dielectric material over the metal-containing material and within the gap;
forming patterned photoresist over the second dielectric material; the patterned photoresist having at least one cross-section comprising a pair of portions having a space between them, said space being directly over the gap and also being directly over sections of the metal-containing material adjacent the gap;
etching the first and second dielectric materials through the space in the patterned photoresist to expose the sections of the metal-containing material, and to expose the metal-containing segment;
removing the exposed metal-containing segment to form an opening over the one or more electromagnetic radiation-detecting sensors;
forming a first material within the opening to line the opening;
forming color filter material within the lined opening; and
forming lens material within the lined opening and over the color filter material, wherein the exposed sections of the metal-containing material are not entirely removed during the removal of the metal-containing segment.

21. The method of claim 20 wherein the one or more electromagnetic radiation-detecting sensors are CMOS sensors.

22. The method of claim 20 wherein the first material consists of silicon nitride.

23. The method of claim 20 wherein at least some of the exposed sections of the metal-containing material are removed during the removal of the metal-containing segment.

24. The method of claim 20 wherein the first and second dielectric materials are the same composition as one another.

25. The method of claim 20 wherein the metal-containing segment and the metal-containing material are the same composition as one another.

26. The method of claim 20 wherein the metal-containing segment and the metal-containing material are different in composition from one another.

27. A method of forming an opening, comprising:
   forming a first metal-containing structure over a region of a semiconductor substrate, the first metal-containing structure having a laterally-extending width;
   forming a first dielectric material over the first metal-containing structure;
   forming a first metal-containing material over the first dielectric material; the first metal-containing material being patterned to have a first gap extending therethrough; the first gap being at least as wide as the first metal-containing structure and being directly over the first metal-containing structure;
   forming a second dielectric material over the first metal-containing material and within the first gap;
   forming a second metal-containing structure over the second dielectric material and directly over the first metal-containing structure, the second metal-containing structure having about the same laterally-extending width as the first metal-containing structure;
   forming a third dielectric material over the second metal-containing structure;
   forming a second metal-containing material over the third dielectric material; the second metal-containing material being patterned directly over the first metal-containing material and being patterned to have a second gap that is about the same width as the first gap and that is directly over the first gap;
   forming a patterned mask over the second metal-containing material; the patterned mask having a laterally-extending cross-section comprising a pair of portions with a space between them, said space being directly over the first and second metal-containing structures;
   etching through the space to remove the third dielectric material from over the second metal-containing structure and thereby expose the second metal-containing structure;
   removing the exposed second metal-containing structure to form an opening to the second dielectric material;
   removing the first and second dielectric materials from within the opening to expose the first metal-containing structure; and
   removing the first metal-containing structure to extend the opening, wherein the first and second metal-containing structures are the same in composition as one another; and
   wherein the first and second metal-containing materials are the same in composition as the first and second metal-containing structures.

28. The method of claim 27 wherein the space between the portions of the patterned mask is wider than the second metal-containing structure and directly over sections of the second metal-containing material laterally adjacent the second metal-containing structure, and wherein the sections of the second metal-containing material are exposed during the removal of the third dielectric material.

29. The method of claim 27 wherein the patterned mask comprises of photoresist.

30. The method of claim 27 wherein the opening is formed over one or more electromagnetic radiation-detecting sensors, and further comprising forming one or both of color filter material and lens material within the opening.

* * * * *